(12) United States Patent
Apalkov et al.

(10) Patent No.: US 10,170,690 B2
(45) Date of Patent: Jan. 1, 2019

(54) HYBRID-FL WITH EDGE-MODIFIED COUPLING

(71) Applicant: Samsung Electronics Co., Ltd., Suwon-si, Gyeonggi-do (KR)

(72) Inventors: Dmytro Apalkov, San Jose, CA (US); Donkoun Lee, Sunnyvale, CA (US); Mohamad Krounbi, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 9 days.

(21) Appl. No.: 15/080,572

(22) Filed: Mar. 24, 2016

(65) Prior Publication Data

US 2017/0141297 A1 May 18, 2017

Related U.S. Application Data

(60) Provisional application No. 62/256,104, filed on Nov. 16, 2015.

(51) Int. Cl.
*H01L 29/82* (2006.01)
*H01L 43/08* (2006.01)
*H01L 43/10* (2006.01)
*H01L 43/12* (2006.01)

(52) U.S. Cl.
CPC .............. *H01L 43/08* (2013.01); *H01L 43/10* (2013.01); *H01L 43/12* (2013.01)

(58) Field of Classification Search
CPC .......... H01L 43/02; H01L 43/10; H01L 43/12
See application file for complete search history.

(56) References Cited

U.S. PATENT DOCUMENTS

| | | | |
|---|---|---|---|
| 7,379,280 B2* | 5/2008 | Fukumoto | B82Y 25/00 257/E27.005 |
| 7,981,697 B2* | 7/2011 | Wang | G11C 11/15 257/295 |
| 8,045,366 B2 | 10/2011 | Zheng et al. | |
| 9,048,412 B2 | 6/2015 | Oh et al. | |
| 2014/0210021 A1 | 7/2014 | Zhu et al. | |
| 2015/0008547 A1 | 1/2015 | Pi et al. | |

* cited by examiner

*Primary Examiner* — Steven Loke
*Assistant Examiner* — Scott Stowe
(74) *Attorney, Agent, or Firm* — Renaissance IP Law Group LLP

(57) ABSTRACT

A magnetic memory device and a method to make the device is disclosed. The magnetic memory device comprises a free magnetic layer that includes a hard magnetic material layer, a soft magnetic material layer and a coupling layer that is between the hard magnetic material layer and the soft magnetic material layer. The coupling layer comprises a magnetic material that has oxidized edges. In one embodiment, the magnetic material of the coupling layer comprises a Heusler alloy or a silicon-based magnetic material. A predetermined amount of the coupling layer is oxidized to controllably reduce the switching current $J_{c0}$ of the free magnetic layer to be about half of the switching current if the coupling layer comprised substantially all magnetic material and no oxide.

20 Claims, 9 Drawing Sheets

HYBRID-FL WITH EDGE-MODIFIED COUPLING

CROSS-REFERENCE TO RELATED APPLICATION

This patent application claims the priority benefit under 35 U.S.C. § 119(e) of U.S. Provisional Patent Application No. 62/256,104 filed on Nov. 16, 2015, the disclosure of which is incorporated herein by reference in its entirety.

TECHNICAL FIELD

The subject matter disclosed herein generally relates to memory devices, and more particularly, to magnetic memory devices.

BACKGROUND

Commonly known magnetic memory devices may include a magnetic tunnel junction pattern (MTJ) that is formed by two magnetic substances and an insulation layer interposed therebetween. The resistance value of the MTJ pattern may be varied according to the magnetization directions of the two magnetic substances with respect to each other. In some embodiments, a switching current $J_{c0}$ is passed through the MTJ pattern to vary the magnetization direction of one of the magnetic substances with respect to the other magnetic substance. If the magnetization directions of the two magnetic substances are anti-parallel to each other, the magnetic tunnel junction pattern may have a high resistance value. If the magnetization directions of the two magnetic substances are parallel to each other, the magnetic tunnel junction pattern may have a low resistance value. The difference between the resistance values of the two magnetization states may be used to write/read data.

SUMMARY

An exemplary embodiment provides a magnetic memory device comprising a free magnetic layer that comprises a first magnetic material layer comprising a first magnetic anisotropy and a first surface extending substantially in a first plane; a second magnetic material layer comprising a second magnetic anisotropy and a second surface extending substantially in a second plane that is substantially parallel to the first plane in which the second magnetic anisotropy is less that the first magnetic anisotropy; and a coupling layer comprising a center, a first surface, a second surface and an edge extending between the first surface and the second surface in which a first section of the coupling layer between the center and a predetermined distance from the center comprises a magnetic material, and a second section of the coupling layer between the predetermined distance from the center to the edge comprises a non-magnetic material in which the coupling layer is disposed between the first magnetic layer and the second magnetic layer and the first surface of the coupling layer is in contact with the first surface of the first magnetic layer and the second surface of the coupling layer being in contact with the second surface of the second magnetic layer. In one exemplary embodiment, the magnetic material of the coupling layer comprises a Heusler alloy or a silicon-based magnetic material, and the non-magnetic material of the coupling layer comprises an oxide material. The predetermined distance may be based on a switching current $J_{c0}$ of the free magnetic layer being about half of a switching current if the coupling layer comprises substantially all magnetic material. The predetermined distance may be further based on a magnetic coupling strength between the first magnetic layer and the second magnetic layer and may be selected to maximize the ratio of thermal stability to switching current.

One exemplary embodiment comprises a magnetic memory device comprising a reference magnetic layer and a free magnetic layer. The free magnetic layer comprises a hard magnetic material layer comprising a first surface extending substantially in a first plane; a soft second magnetic material layer comprising a second surface extending substantially in a second plane that is substantially parallel to the first plane, the second magnetic anisotropy being less that the first magnetic anisotropy; and a coupling layer comprising a center, a first surface, a second surface and an edge extending between the first surface and the second surface, a first section of the coupling layer between the center and a first predetermined distance from the center comprising a magnetic material, and a second section of the coupling layer between the first predetermined distance from the center to the edge comprising a non-magnetic material, the first surface of the coupling layer being in contact with the first surface of the hard magnetic layer and the second surface of the coupling layer being in contact with the second surface of the soft magnetic layer.

One exemplary embodiment provides a method to form a magnetic memory device in which the method comprises forming a first magnetic material layer comprising a first magnetic anisotropy and a first surface extending substantially in a first plane; forming a coupling layer on the first magnetic material layer in which the coupling layer comprises a magnetic material, a first surface, a second surface and an edge, in which the first surface of the coupling layer is in contact with the first magnetic layer, and extends in a direction that is substantially parallel to the first plane from a center of the coupling layer to the edge of the coupling layer; forming a second magnetic material layer on and in contact with the second surface of the coupling layer in which the second magnetic layer comprises a second magnetic anisotropy that is less than the first magnetic anisotropy; and subjecting the edge of the coupling layer to a predetermined temperature for a predetermined amount of time to change a predetermined distance of the coupling layer measured from the edge toward the center of the coupling layer to be a non-magnetic material.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

Figure 1:
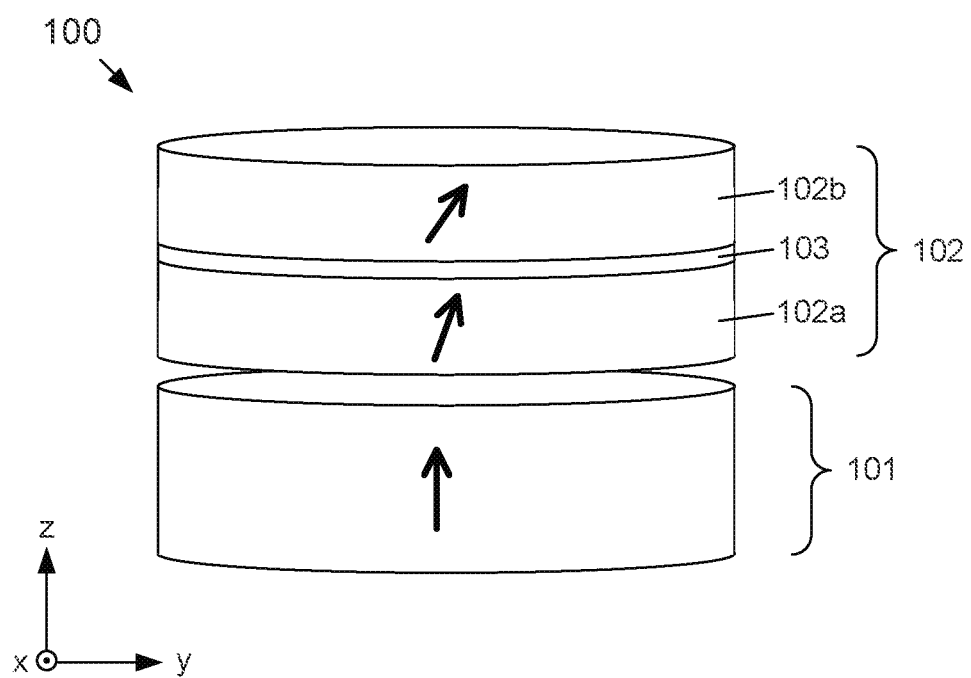
FIG. 1 generally depicts selected layers of an exemplary embodiment of a magnetic tunneling junction (MTJ) device according to the subject matter disclosed herein.

The subject matter disclosed herein relates to an arrangement of a magnetic tunnel junction (MTJ) device and a method to make the MTJ device that comprises a hybrid free layer having a controllably reduced switching current $J_{c0}$ for changing a storage state of the magnetic tunnel junction device.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment is included in at least one embodiment disclosed herein. Thus, the appearances of the phrases "in one embodiment" or "in an embodiment" or "according to one embodiment" (or other phrases having similar import) in various places throughout this specification are not necessarily all referring to the same embodiment. As used herein, the word "exemplary" means "serving as an example, instance, or illustration." Any embodiment described herein as "exemplary" is not to be construed as necessarily preferred or advantageous over other embodiments. Furthermore, the particular features, structures, or characteristics may be combined in any suitable manner in one or more embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

The exemplary embodiments described herein are described in the context of particular magnetic junctions and magnetic memories having certain components, arrangements and/or configurations. It should be understood that the subject matter disclosed herein is consistent with the use of magnetic junctions and magnetic memories having other and/or additional components and/or other features that are not inconsistent with the subject matter disclosed herein. A method and system are also disclosed in the context of current understanding of the spin-transfer phenomenon, of magnetic anisotropy, and/or of other physical phenomenon. Consequently, it should be understood that any theoretical explanations of behavior of the disclosed method and system are made based upon this current understanding of spin transfer, magnetic anisotropy and/or other physical phenomenon. The disclosed method and system described herein, however, are not dependent upon a particular physical explanation. It should also be understood that the disclosed method and system are described in the context of a structure having a particular arrangement and/or configuration. It should be understood that the method and system may be consistent with other structures. Additionally, the disclosed method and system are described in the context of certain layers being simple, multilayer and/or synthetic. It should be understood, however, that the layers may have another structure. Furthermore, the method and system are described in the context of magnetic junctions and/or substructures having particular layers. It should be understood that magnetic junctions and/or substructures having additional and/or different layers that are not inconsistent with the disclosed method and system could also be used. Moreover, certain components may be described as being magnetic, ferromagnetic, and ferrimagnetic. As used herein the term "magnetic" or "ferromagnetic" includes, but is not limited to ferromagnets and ferrimagnets. The method and system are also disclosed in the context of single magnetic junctions and substructures. It should be understood that the disclosed method and system are consistent with the use of magnetic memories having multiple magnetic junctions and using multiple substructures. Further, as used herein, the term "in-plane" is substantially within or substantially parallel to the plane of one or more of the layers of a magnetic junction. Conversely, the term "perpendicular" corresponds to ta direction that is substantially perpendicular to one or more of the layers of the magnetic junction.

The subject matter disclosed herein relates to a magnetic tunnel junction device arrangement comprising a hybrid free layer that has a controllably reduced switching current $J_{c0}$ for changing a storage state of the magnetic tunnel junction device. Additionally, the subject matter disclosed herein relates to a method to make a magnetic tunnel junction device comprising a hybrid free layer having controllably reduced switching current $J_{c0}$ for changing a storage state of the magnetic tunnel junction device.

FIG. 1 generally depicts selected layers of an exemplary embodiment of a magnetic tunneling junction (MTJ) device 100 according to the subject matter disclosed herein. MTJ device 100 may comprise a reference layer 101 and a hybrid free layer 102. The hybrid free layer 102 may comprise a soft magnetic layer 102a, a hard magnetic layer 102b and a coupling layer 103 disposed between and in contact with the soft magnetic layer 102a and the hard magnetic layer 102b. According to the subject matter disclosed herein, edges of the coupling layer 103 have been modified to controllably reduce the magnetic coupling $J_{ex}$ between the soft magnetic layer 102a and the hard magnetic layer 102b and to thereby controllably reduce the switching current $J_{c0}$ that is needed to switch the magnetization orientation of the hybrid free layer 102.

In the embodiment of MTJ device 100 depicted in FIG. 1, the reference layer 101, the hybrid free layer and the other layers that are not shown are generally arranged in a planar layer that is oriented substantially parallel to the x-y plane in which the x-axis is indicated as extending outwardly from (and inwardly to) the plane of the figure, and the y-axis is indicated as extending horizontally in the figure and perpendicular to the x-axis. That is, the various layers comprising MTJ device 100 extend in a planar direction that is substantially parallel to the x-y plane. The various layers of the MTJ device 100 are arranged, or stacked, with respect to each other along the z-axis in which the z-axis is oriented upwardly in the figure and perpendicular to both the x- and y-axes. The same Cartesian axis system is used in the various figures herein. The particular Cartesian axis system used herein has been selected for convenience and it should be understood that an alternative Cartesian axis system could be used.

Although only the reference layer 101 and the hybrid free layer 102 are depicted in FIG. 1, it should be understood that MTJ device 100 may comprise additional layers that are not shown. Additionally, it should also be understood that the space, or gap, depicted between the reference layer 101 and the hybrid free layer 102 may comprise other possible layers that are not shown and that may be disposed in the space depicted. For example, MTJ device 101 may comprise other layers, such as, but not limited to, a bottom contact, one or more seed layers, an antiferromagnetic (AFM) layer, one or more additional reference layers, one or more polarization enhancement layers (PELs), a tunneling barrier layer, one or more additional free layers, a capping layer, and a top contact, in which one or more of the other layers may be disposed in the space between the reference layer 101 and the hybrid free layer 102.

Additionally, although the relative positions of the reference layer 101 and hybrid free layer 102 with respect to the space and to each other are shown in FIG. 1 with the reference layer 101 below the hybrid free layer 102, it should be understood that alternative embodiments of the MTJ device 100 may have the reference layer 101 above the hybrid free layer 102. Further, it should be understood that the relative positions of the soft magnetic layer 102a being depicted as proximate to the space, or gap, and the hard magnetic layer 102b being depicted as distal to the space, or gap, may be switched in an alternative embodiment of the MTJ device 100.

In one embodiment, MTJ device 100 may be configured to operate as a memory cell in, for example, a magnetic random access memory (MRAM) in which data may be stored in the memory cell based on resistance-value differences that are related to whether the respective magnetization directions of the reference layer 101 and the hybrid free layer 102 are parallel or anti-parallel. In one embodiment, the magnetization direction of the hybrid free layer 102 may be varied according to the direction of a switching current $J_{c0}$ supplied to the MTJ device 100. For example, the magnetization direction of the hybrid free layer 102 may be changed to be anti-parallel to the magnetization of the reference layer 101 for a switching current $J_{c0}$ supplied from the hybrid free layer 102 to the reference layer 101, and may be changed to be parallel to the magnetization of the reference layer 101 for a switching current $J_{c0}$ supplied from the reference layer 101 to the hybrid free layer 102.

In one embodiment, the anisotropy of the reference layer 101 and the layers of the hybrid free layer 102 may favor a horizontal magnetization, i.e., in a direction that is substantially parallel to the x-y plane. In another embodiment, the anisotropy of the reference layer and the hybrid free layer 102 may favor a vertical, or perpendicular, magnetization, i.e., in the direction of the z-axis in FIG. 1. For example, the magnization of the reference layer 101 is depicted in FIG. 1 as a perpendicular magnetization, as indicated by an upward arrow. In yet another embodiment, the anisotropy of the hybrid free layer 102 may include a vertical magnetization component and a horizontal magnetization component. For example, in FIG. 1, the magnetization of the soft magnetic layer 102a and the hard magnetic layer 102b are both depicted as having a vertical magnetization component and a horizontal magnetization component, as indicated by arrows having both a vertical component and a horizontal component.

In one embodiment, the reference layer 101 may comprise a magnetic moment that is fixed, or pinned, in a particular direction by, for example, an exchange-bias interaction with an AFM layer (not shown in FIG. 1). In one embodiment, the reference layer 101 may comprise a single layer structure. Alternatively, the reference layer 101 may comprise one or more multilayer structures, although not shown in FIG. 1. In one embodiment, the reference layer 101 may include one or more polarization enhancement layers that may include CoFeB or FeB. In another embodiment, the reference layer 101 may comprise a synthetic anti-ferromagnetic (SAF) layer that includes magnetic layers antiferromagnetically or ferromagnetically coupled through conductive thin layers, such as ruthenium (Ru). In such a SAF, multiple magnetic layers interleaved with thin layer(s) of Ru or other material may be used. In another embodiment, the coupling across the Ru layers may be ferromagnetic.

The reference layer 101 may contain iron (Fe), cobalt (Co) and/or nickel (Ni). For example, the reference layer 101 may comprise at least one material selected from the group consisting of CoFeB, Fe, Co, Ni, Gd, Dy, CoFe, NiFe, MnAs, MnBi, MnSb, CrO, $MnOFe_2O_3$, $FeOFe_2O_3$, $NiOFe_2O_3$, $CuOFe_2O_3$, EuO, and/or $Y_3Fe_5O_{12}$. In one embodiment, the reference layer 101 may comprise one or more ferromagnetic layers and one or more non-magnetic layers. The ferromagnetic layers may contain iron (Fe), cobalt (Co) and/or nickel (Ni), and the non-magnetic layers may contain at least one selected from the group consisting of aluminum (Al), boron (B) chromium (Cr), platinum (Pt), palladium (Pd), iridium (Jr), ruthenium (Ru), rhodium (Rh), osmium (Os), rhenium (Re), tantalum (Ta), titanium (Ti), silicon (Si), silver (Ag), gold (Au), copper (Cu), zinc (Zn), carbon (C) and/or nitrogen (N). In one embodiment, reference layer 101 may comprise, for example, [Co/Pt]m, [Co/Pd]m, or [Ni/Pt]m in which m is a stacking number of each layer and is an integer greater than or equal to 2, or a combination thereof. In one embodiment, the ferromagnetic layers and the non-magnetic layers may be respectively stacked in a range of about 2 to about 20 times. In one embodiment, the thickness of reference layer 101 is less than about 50 nm. In another embodiment, the thickness of reference layer 101 is less than about 30 nm.

In one embodiment, the hybrid free layer 102 of magnetic junction device 100 may comprise a soft magnetic layer 102a, a hard magnetic layer 102b and a coupling layer 103 disposed between and in contact with the soft magnetic layer 102a and the hard magnetic layer 102b. The soft magnetic layer 102a and the hard magnetic layer 102b are magnetically coupled by a ferromagnetic coupling $J_{ex}$ that can be controlled as will be described herein. By controlling the magnetic coupling $J_{ex}$, the switching current $J_{c0}$ can also be controlled.

In one embodiment, the soft magnetic layer 102a may comprise a single layer structure. Alternatively, the soft magnetic layer 102a may comprise one or more multilayer structures that are not shown in FIG. 1. The soft magnetic layer 102a may comprise a low magnetic coercivity material, such as CoFeB with not more than forty percent B. Other materials that are suitable for the soft magnetic layer 102a include FeB, Fe, CoFe, Co$_2$FeSi and Co$_2$FeAl.

In one embodiment, the hard magnetic layer 102b may comprise a single layer structure. Alternatively, the hard magnetic layer 102b may comprise one or more multilayer structures that are not shown in FIG. 1. The hard magnetic layer 102b may comprise a high magnetic coercivity ($H_c$) material, a high magnetic coercivity material. Suitable materials for the hard magnetic layer 102b may include at least one material selected from the group consisting of CoFeB, Fe, Co, Ni, Gd, Dy, CoFe, NiFe, MnAs, MnBi, MnSb, CrO, MnOFe$_2$O$_3$, FeOFe$_2$O$_3$, NiOFe$_2$O$_3$, CuOFe$_2$O$_3$, EuO, and/or Y$_3$Fe$_5$O$_{12}$. In one embodiment, the hard magnetic layer 102b may comprise one or more ferromagnetic layers and one or more non-magnetic layers. The ferromagnetic layers may contain iron (Fe), cobalt (Co) and/or nickel (Ni), and the non-magnetic layers may contain at least one selected from the group consisting of aluminum (Al), boron (B) chromium (Cr), platinum (Pt), palladium (Pd), iridium (Jr), ruthenium (Ru), rhodium (Rh), osmium (Os), rhenium (Re), tantalum (Ta), titanium (Ti), silicon (Si), silver (Ag), gold (Au), copper (Cu), zinc (Zn), carbon (C) and/or nitrogen (N). In one embodiment, reference layer 101 may comprise, for example, [Co/Pt]m, [Co/Pd]m, or [Ni/Pt]m in which m is a stacking number of each layer and is an integer greater than or equal to 2, or a combination thereof. In one embodiment, the thickness of the hard magnetic layer 102b is less than about 3 nm. In another embodiment, the thickness of hard magnetic layer 102b is less than about 2 nm.

The coupling layer 103 may be disposed between and in contact with the soft magnetic layer 102a and the hard magnetic layer 102b. In one embodiment, the material used for the coupling layer 103 is a magnetic material that generally provides a strong ferromagnetic magnetic coupling characteristic between the soft magnetic layer 102a and the hard magnetic layer 102b. According to the subject matter disclosed herein, however, the overall magnetic coupling characteristic of the material of the coupling layer 103 may be reduced by, for example, oxidizing the exposed edges of the coupling layer 103 to make a selected portion of the coupling layer 103 non-magnetic. By reducing the overall magnetic coupling characteristic of the coupling layer 103, the switching current $J_{c0}$ needed for switching the magnetization direction of the hybrid free layer 102 is also reduced. That is, the magnitude of the switching current $J_{c0}$ to switch the magnetization direction of the hybrid free layer 102 can be reduced by modifying, or oxidizing, the magnetic coupling characteristics at the edges of the coupling layer 103. The amount of the material at the edges of the coupling layer 103 that is oxidized (and thereby made non-magnetic) can be selectively varied to control the ferromagnetic coupling between the soft magnetic layer 102a and the hard magnetic layer 102b, and to thereby control the switching current $J_{c0}$.

In one embodiment, the material used for the coupling layer 103 may comprise a Heusler alloy that includes manganese (Mn), silicon (Si) and/or germanium (Ge). In another embodiment, the coupling layer 103 may comprise a silicon-based magnetic material, such as, but not limited to FeSi and/or CoSi. The materials that are suitable for the coupling layer 103 comprise a Gibbs free energy of oxide formation in a high vacuum and at room temperature that is lower than the Gibbs free energy of oxide formation for magnetic materials, such as, cobalt (Co), iron (Fe) and nickel (Ni), i.e., the magnetic materials that are used for the soft magnetic layer 102a and the hard magnetic layer 102b.

Figure 2:
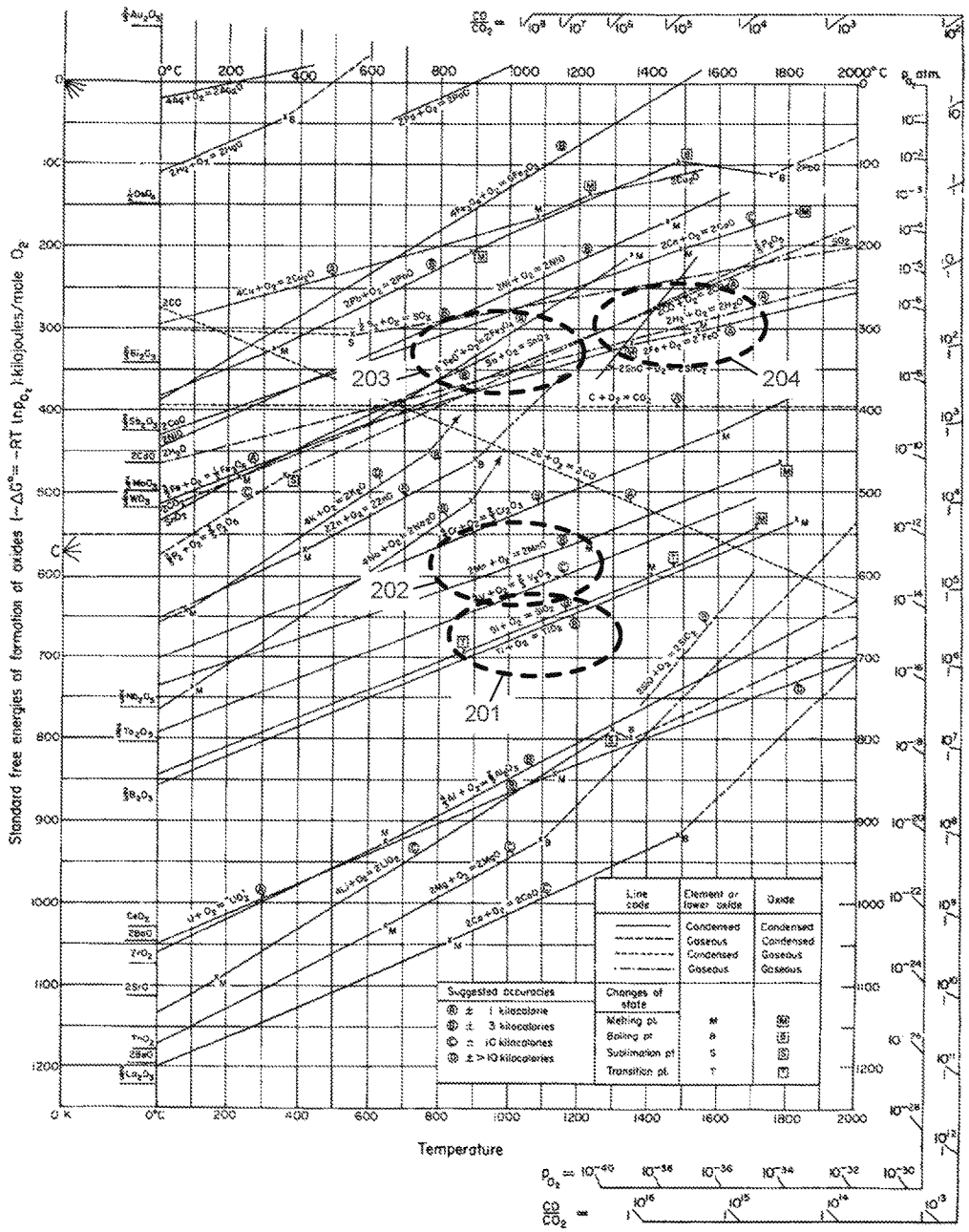
FIG. 2 is an Ellingham diagram of standard free energies of formation of oxides for metals.

FIG. 2 is an Ellingham diagram of standard free energies of formation of oxides for metals. As indicated in FIG. 2, the free energies of SiO$_2$ and TiO$_2$, indicated at 201, and MnO and V$_2$O$_3$, indicated at 202, are less than the free energies of Fe$_2$O$_3$ and SnO$_2$, indicated at 203, and FeO, indicated at 204, by about 200 kilojoules/mole O$_2$ to 250 kilojoules/mole O$_2$ between about 200° C. and 450° C. A suitable range of differences of free energies of formation of an oxide between the material of the coupling layer 103 and the materials of the soft and hard magnetic layers 102a and 102b is about 50 kJ/mole.

Figure 3A:
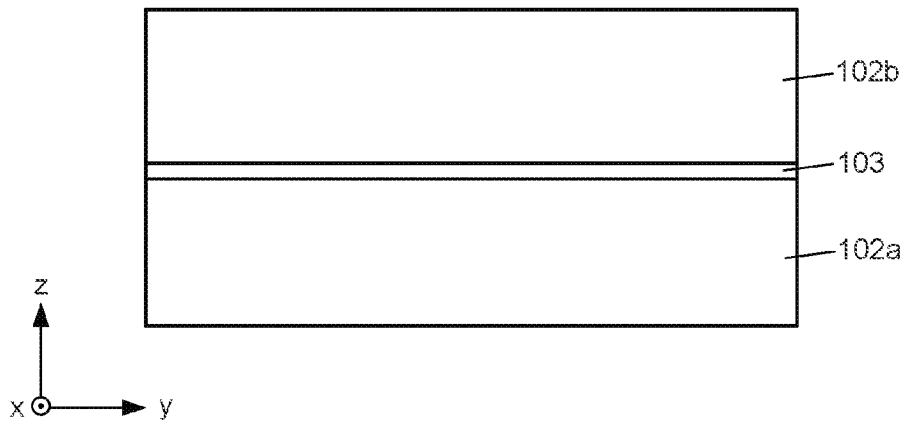
FIGS. 3A and 3B respectively depict fabrication stages an exemplary embodiment of a hybrid free layer according to the subject matter disclosed herein.
Figure 3B:
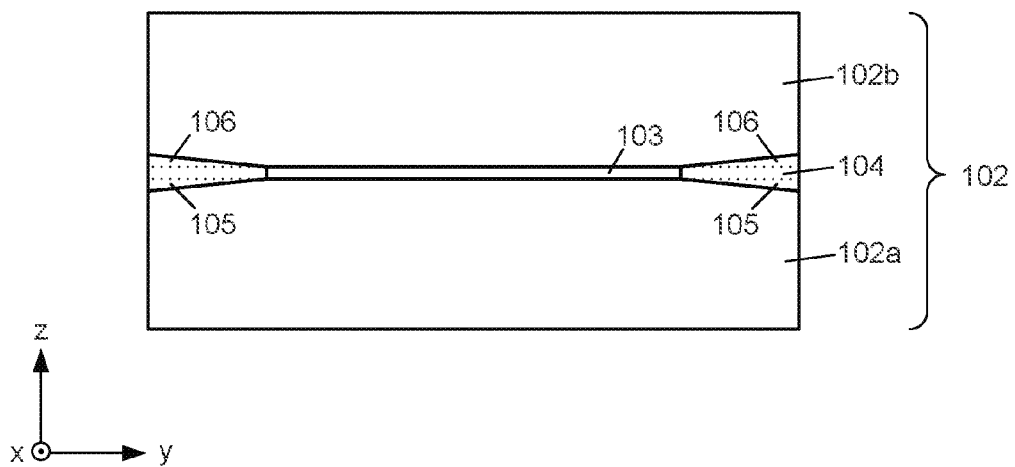

FIGS. 3A and 3B respectively depict fabrication stages an exemplary embodiment of a hybrid free layer 102 according to the subject matter disclosed herein. FIG. 3A depicts a portion of an MTJ structure that includes a soft magnetic layer 102a, a hard magnetic layer 102b and a coupling layer 103 disposed between and in contact with the soft magnetic layer 102a and the hard magnetic layer 102b. The soft magnetic layer 102a, the coupling layer 103 and the hard magnetic layer 102b are formed using well-known techniques, such as, but not limited to atomic layer deposition (ALD), chemical vapor deposition (CVD) or Physical Vapor Deposition (PVD). The portion of the MTJ structure shown in FIG. 3A may be patterned using a well-known technique to expose the side surfaces, or edges, of the soft magnetic layer 102a, the coupling layer 103 and the hard magnetic layer 102b. It should be understood that the portion of the MTJ structure depicted in FIG. 3A may comprise additional layers that are not shown.

In FIG. 3B, the exposed edges of the coupling layer 103 have been oxidized at 104, thereby reducing the overall magnetic coupling characteristics of the coupling layer 103. In particular, the exposed edges of the coupling layer 103 are oxidized in a well-known manner in an oxygen-rich atmosphere at between 200° C. and 450° C. inclusive for between about 10 seconds and about 600 seconds inclusive. As also depicted in FIG. 3B, a relatively small amount of both the soft magnetic layer 102a and the hard magnetic layer 102b may also respectively oxidized as indicated at 105 and 106; however, the amounts that may be oxidized at 305 and 306 are relatively small in comparison to the amount of coupling layer 103 that is oxidized at 304 and are not necessarily drawn to scale.

Figure 4:
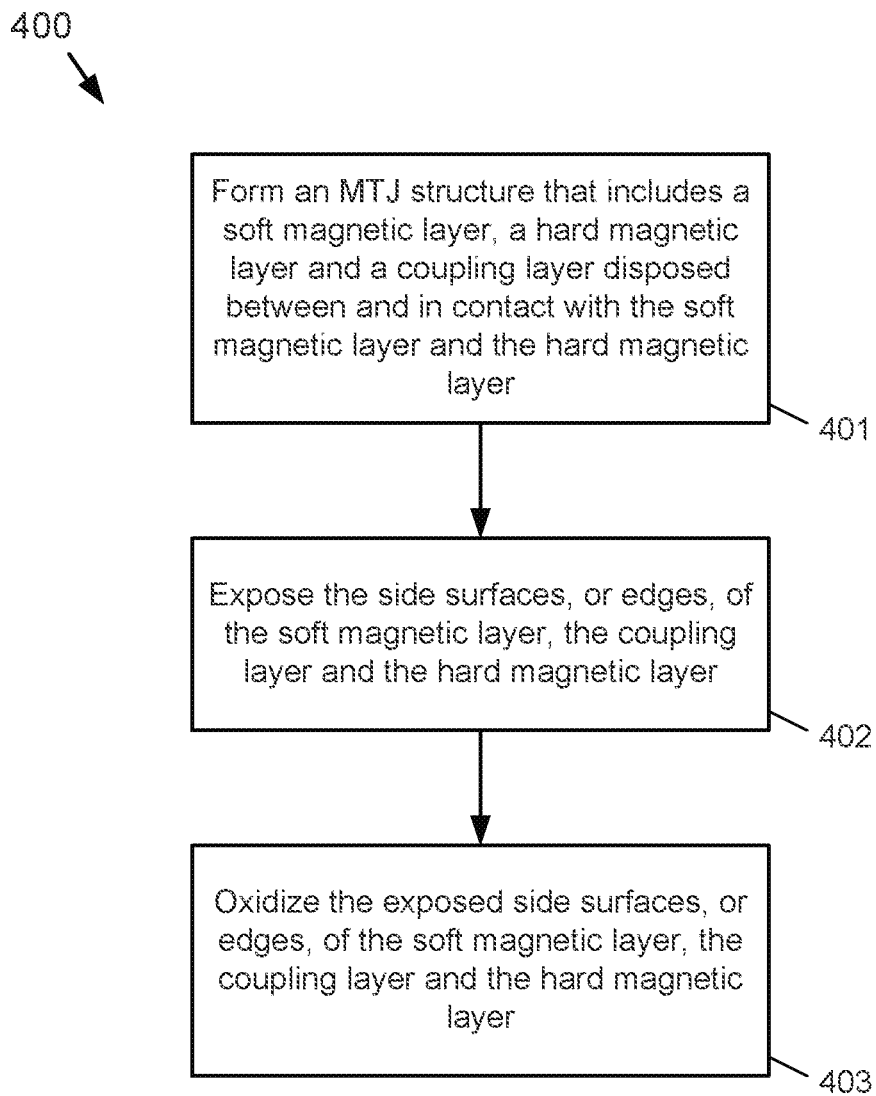
FIG. 4 is an exemplary embodiment of a method to form a hybrid free layer according to the subject matter disclosed herein.

FIG. 4 is an exemplary embodiment of a method 400 to form a hybrid free layer according to the subject matter disclosed herein. At 401, an MTJ structure is formed using well-known techniques, such as, but not limited to atomic layer deposition (ALD), chemical vapor deposition (CVD) or Physical Vapor Deposition (PVD). The MTJ structure thus formed includes a soft magnetic layer 102a, a hard magnetic layer 102b and a coupling layer 103 disposed between and in contact with the soft magnetic layer 102a and the hard magnetic layer 102b. At 402, the MTJ structure is patterned using well-known techniques to expose the side surfaces, or edges, of the soft magnetic layer 102a, the coupling layer 103 and the hard magnetic layer 102b. At 403, the exposed edges of the coupling layer 103 are oxidized using a well-known technique in an oxygen-rich atmosphere at between 200° C. and 450° C. inclusive for between about 10 seconds and about 600 seconds inclusive.

FIGS. 5A-5E depict graphs of simulations of the mean switching current $J_{c0}$ as a function of the remaining unmodified coupling layer material for different ferromagnetic coupling strengths $J_{ex}$ between the soft and hard magnetic material layers for a hybrid free layer according to the subject matter disclosed herein. In each of the FIGS. 5A-5E, the abscissa is the radius of the unmodified coupling material $R_{cen}$ remaining after oxidation based on an unmodified radius of 10 nm. The ordinate in each of the FIGS. 5A-5E, is the bivariate fit of the mean switching current $J_{c0}$ in $10^6$ A/cm$^2$. As can be seen in FIGS. 5A-5E, by selectively modifying the edges of the coupling layer 103 to make the edges non-magnetic, the switching current $J_{c0}$ can be reduced by about a factor of 2 in comparison to completely unmodified coupling layer (i.e., entirely a magnetic coupling layer).

Figure 5A:
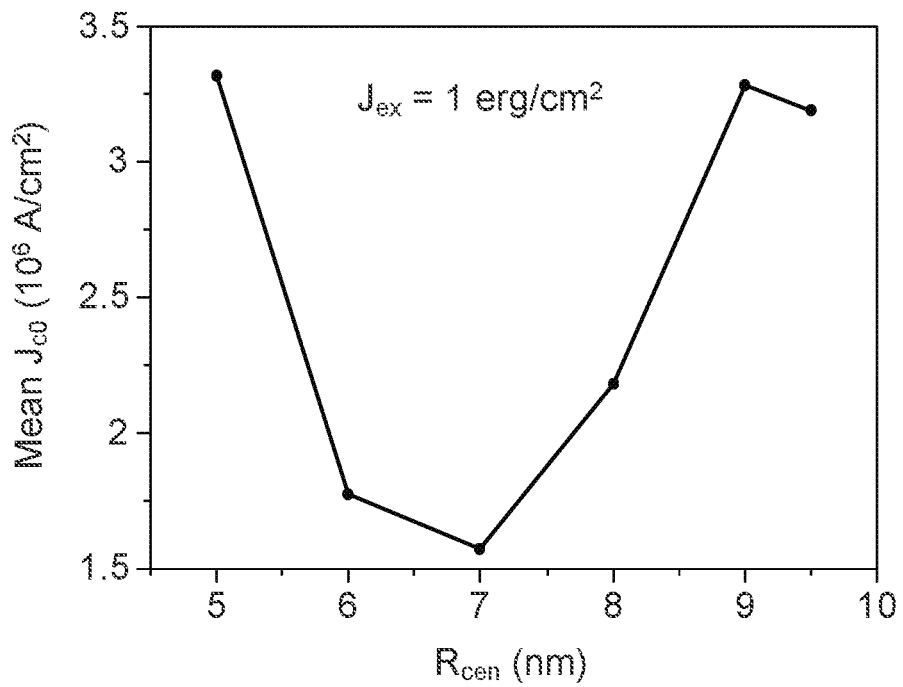
FIGS. 5A-5E depict graphs of simulations of the mean switching current $J_{c0}$ as a function of the remaining unmodified coupling layer material for different ferromagnetic coupling strengths $J_{ex}$ between the soft and hard magnetic material layers for a hybrid free layer according to the subject matter disclosed herein.

In FIG. 5A, the ferromagnetic coupling strength $J_{ex}$ between the soft magnetic layer 102a and the hard magnetic layer 102b is 1 erg/cm$^2$. As shown in FIG. 5A, for an unmodified radius of the coupling layer 103 of about 7 nm, the mean switching current $J_{c0}$ is reduced from about $3\times10^6$ A/cm$^2$ to about $1.6\times10^6$ A/cm$^2$.

Figure 5B:
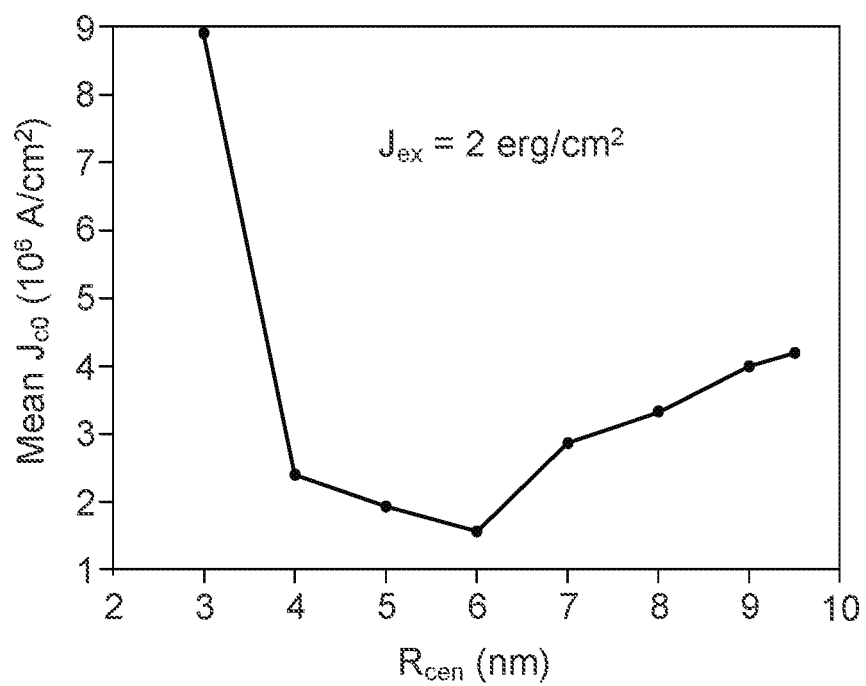

In FIG. 5B, the ferromagnetic coupling strength $J_{ex}$ between the soft magnetic layer 102a and the hard magnetic layer 102b is 2 erg/cm$^2$. As shown in FIG. 5B, for an unmodified radius of the coupling layer 103 of about 6 nm, the mean switching current $J_{c0}$ is from about $4\times10^6$ A/cm$^2$ reduced to about $1.5\times10^6$ A/cm$^2$.

Figure 5C:
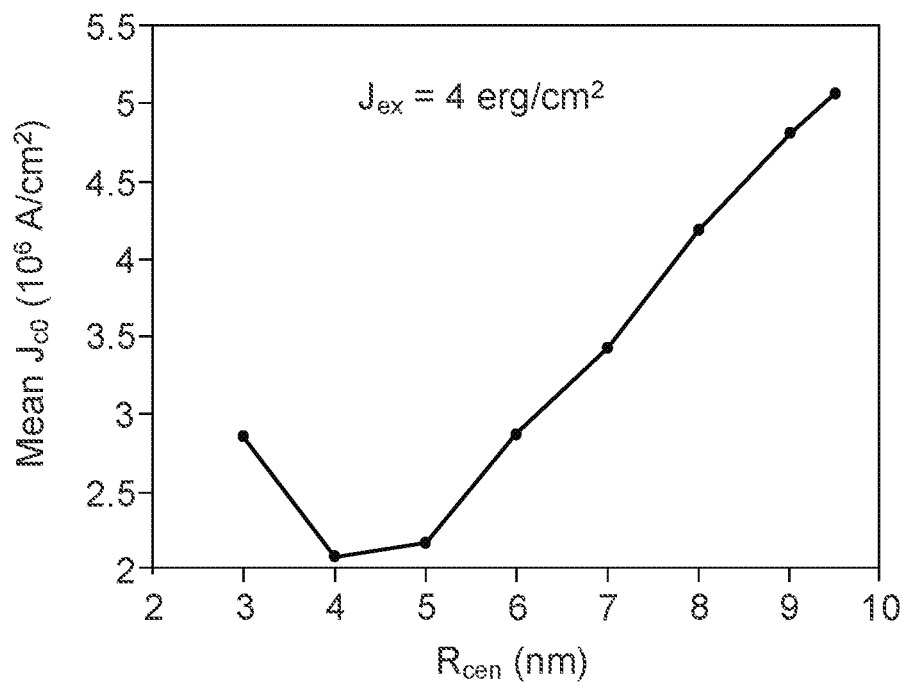

In FIG. 5C, the ferromagnetic coupling strength $J_{ex}$ between the soft magnetic layer 102a and the hard magnetic layer 102b is 4 erg/cm$^2$. As shown in FIG. 5C, for an unmodified radius of the coupling layer 103 of about 4 nm, the mean switching current $J_{c0}$ is reduced from about $5\times10^6$ A/cm$^2$ to about $2.1\times10^6$ A/cm$^2$.

Figure 5D:
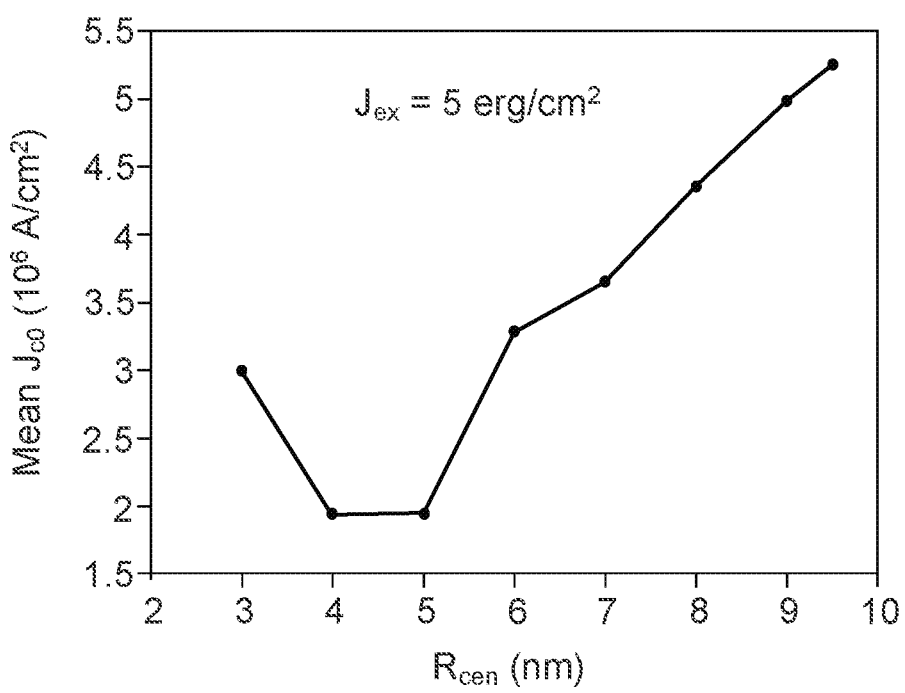

In FIG. 5D, the ferromagnetic coupling strength $J_{ex}$ between the soft magnetic layer 102a and the hard magnetic layer 102b is 5 erg/cm$^2$. As shown in FIG. 5D, for an unmodified radius of the coupling layer 103 of between about 4 nm and about 5 nm, the mean switching current $J_{c0}$ is reduced from about $5.2\times10^6$ A/cm$^2$ to about $2\times10^6$ A/cm$^2$.

Figure 5E:
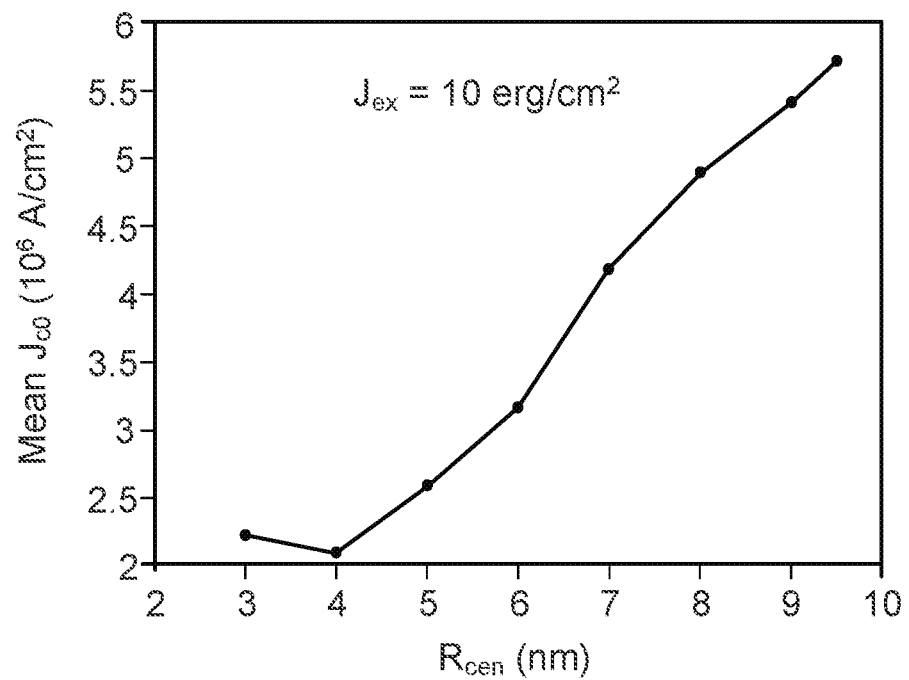

In FIG. 5E, the ferromagnetic coupling strength $J_{ex}$ between the soft magnetic layer 102a and the hard magnetic layer 102b is 10 erg/cm$^2$. As shown in FIG. 5E, for an unmodified radius of the coupling layer 103 of about 4 nm, the mean switching current $J_{c0}$ is reduced from about $5.7\times10^6$ A/cm$^2$ to about $2.1\times10^6$ A/cm$^2$.

Figure 6:
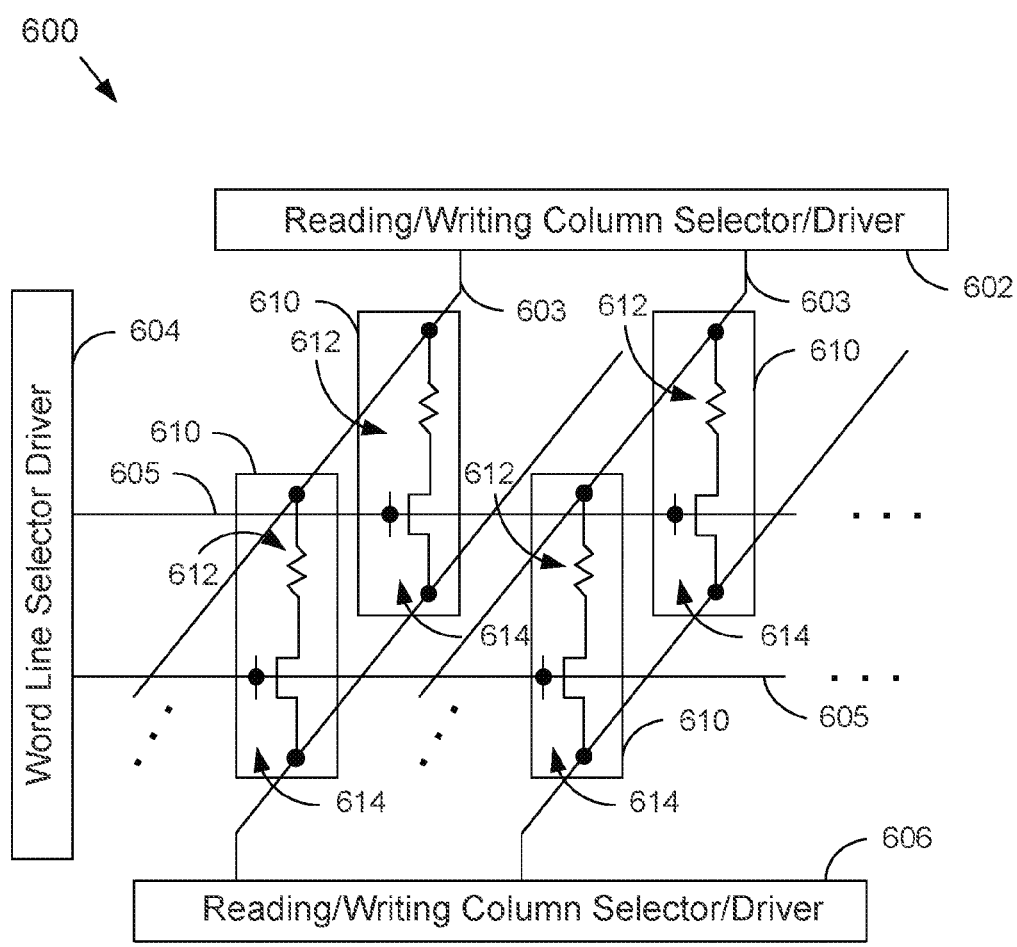
FIG. 6 depicts an exemplary embodiment of a magnetic memory that includes a magnetic tunnel junction (MTJ) device that has a hybrid free magnetic layer according to the subject matter disclosed herein.

FIG. 6 depicts an exemplary embodiment of a magnetic memory 600 that includes a magnetic tunnel junction (MTJ) device that has a hybrid free magnetic layer according to the subject matter disclosed herein. The magnetic memory 600 includes reading/writing column select drivers 602 and 606 and a word line select driver 604. It should be understood that other and/or different components may be provided that are not shown. A storage region of the memory 600 includes a plurality of magnetic storage cells 610 arranged in an array of rows and columns. Each magnetic storage cell 610 includes at least one magnetic junction device 612 and at least one selection device 614. In some embodiments, the selection device 614 is a transistor. The magnetic junction devices 612 may have a hybrid free magnetic layer according to the subject matter disclosed herein. Although one magnetic junction device 612 is shown per cell 610, in other embodiments, a different number of magnetic junction devices 612 may be provided per cell. As such, the magnetic memory 600 may enjoy the benefits described above.

Figure 7:
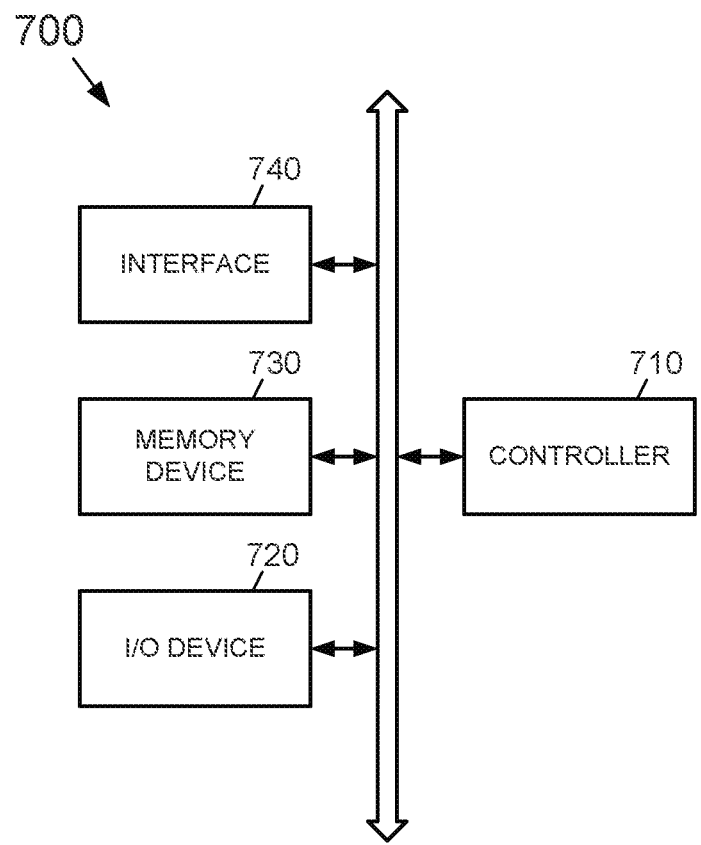
FIG. 7 depicts an electronic device that comprises one or more integrated circuits (chips) comprising a magnetic tunnel junction (MTJ) device that has a hybrid free magnetic layer according to the subject matter disclosed herein.

FIG. 7 depicts an electronic device 700 that comprises one or more integrated circuits (chips) comprising a magnetic tunnel junction (MTJ) device that has a hybrid free magnetic layer according to the subject matter disclosed herein. Electronic device 700 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 700 may comprise a controller 710, an input/output device 720 such as, but not limited to, a keypad, a keyboard, a display, or a touch-screen display, a memory 730, and a wireless interface 740 that are coupled to each other through a bus 750. The controller 710 may comprise, for example, at least one microprocessor, at least one digital signal process, at least one microcontroller, or the like. The memory 730 may be configured to store a command code to be used by the controller 710 or a user data. Electronic device 700 and the various system components comprising electronic device 700 may comprise a magnetic tunnel junction (MTJ) device that has a hybrid free magnetic layer according to the subject matter disclosed herein. The electronic device 700 may use a wireless interface 740 configured to transmit data to or receive data from a wireless communication network using a RF signal. The wireless interface 740 may include, for example, an antenna, a wireless transceiver and so on. The electronic system 700 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Figure 8:
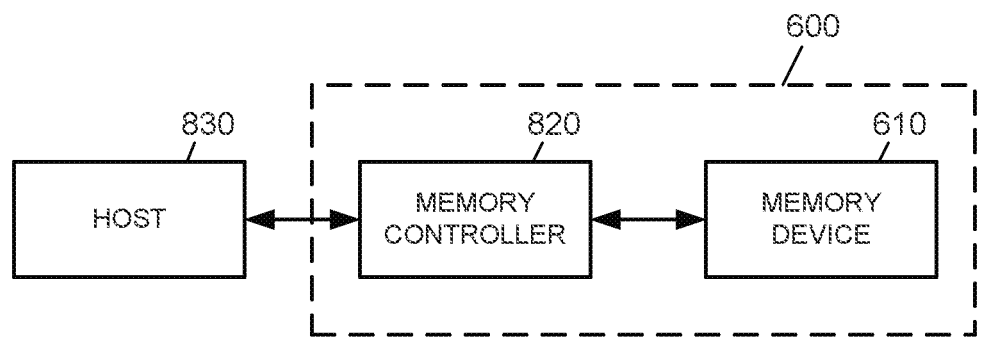
FIG. 8 depicts a memory system 800 that may comprise a magnetic tunnel junction (MTJ) device that has a hybrid free magnetic layer according to the subject matter disclosed herein.

FIG. 8 depicts a memory system 800 that may comprise a magnetic tunnel junction (MTJ) device that has a hybrid free magnetic layer according to the subject matter disclosed herein. The memory system 800 may comprise a memory device 810 for storing large amounts of data and a memory controller 820. The memory controller 820 controls the memory device 810 to read data stored in the memory device 810 or to write data into the memory device 810 in response to a read/write request of a host 830. The memory controller 820 may include an address-mapping table for mapping an address provided from the host 830 (e.g., a mobile device or a computer system) into a physical address of the memory device 810. The memory device 810 may comprise one or more semiconductor devices comprising a magnetic tunnel junction (MTJ) device that has a hybrid free magnetic layer according to the subject matter disclosed herein.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A magnetic memory device, comprising:
   a free magnetic layer comprising:
   a first magnetic material layer comprising a first magnetic anisotropy;
   a second magnetic material layer comprising a second magnetic anisotropy, the second magnetic anisotropy being less than the first magnetic anisotropy; and
   a coupling layer disposed between the first magnetic material layer and the second magnetic material layer, the coupling layer comprising
   a center,
   an edge extending between an edge of the first magnetic material layer and an edge of the second magnetic material layer,
   a magnetic section extended between the center and a predetermined distance from the center, and
   a non-magnetic section extended between the predetermined distance from the center and the edge of the coupling layer,
   wherein the non-magnetic section has an increasing thickness from the predetermined distance to the edge of the coupling layer,
   wherein the non-magnetic section fills a space defined by a bottom surface of the first magnetic material layer, a top surface of the second magnetic material layer and a side surface of the magnetic section of the coupling layer.

2. The magnetic memory device according to claim 1, wherein the magnetic section of the coupling layer is formed of a Heusler alloy, and
   wherein the non-magnetic section of the coupling layer is formed of an oxidized Heusler alloy so that the oxidized Heusler alloy is non-magnetic.

3. The magnetic memory device according to claim 2, wherein the Heusler alloy of the coupling layer includes manganese (Mn), silicon (Si), germanium (Ge), or a combination thereof, and
   wherein the non-magnetic section of the coupling layer is formed of an oxide material.

4. The magnetic memory device according to claim 1, wherein the magnetic section of the coupling layer is formed of a silicon-based magnetic material, and
   wherein the non-magnetic section of the coupling layer is formed of an oxidized silicon-based magnetic material, the oxidized silicon-based magnetic material is non-magnetic.

5. The magnetic memory device according to claim 1, wherein the predetermined distance is such that a magnetic coupling strength between the first magnetic material layer and the second magnetic material layer is reduced to the extent that a switching current of the free magnetic layer is about half compared to if the coupling layer is entirely formed of the magnetic section.

6. The magnetic memory device according to claim 1, further comprising a reference magnetic layer magnetically coupled to the free magnetic layer.

7. The magnetic memory device according to claim 1, wherein the first magnetic material layer is a hard magnetic layer, and
   wherein the second magnetic material layer is a soft magnetic layer.

8. The magnetic memory device according to claim 1, wherein the coupling layer includes a first surface and a second surface,
   wherein the first surface of the coupling layer is flat at the magnetic section and is upwardly curved toward the edge of the coupling layer at the non-magnetic section, and
   wherein the second surface of the coupling layer is flat at the magnetic section and is downwardly curved toward the edge of the coupling layer at the non-magnetic section.

9. The magnetic memory device of claim 1,
   wherein the magnetic section is formed of a magnetic material only, and
   wherein the non-magnetic section is formed of an oxidized form of the magnetic material.

10. A magnetic memory device, comprising:
    a reference magnetic layer;
    a free magnetic layer comprising:
    a hard magnetic material layer having a first magnetic anisotropy;
    a soft magnetic material layer having a second magnetic anisotropy being less than the first magnetic anisotropy; and
    a coupling layer disposed between the hard magnetic material layer and the soft magnetic material layer, the coupling layer comprising
    a center,
    an edge extending between an edge of the hard magnetic material layer and an edge of the soft magnetic material layer,
    a magnetic section of the coupling layer extended between the center and a first predetermined distance from the center, and
    a non-magnetic section of the coupling layer extended between the first predetermined distance from the center and the edge of the coupling layer,
    wherein the non-magnetic section has an increasing thickness from the first predetermined distance to the edge of the coupling layer, and
    wherein the non-magnetic section fills a space defined by a bottom surface of the hard magnetic material layer, a top surface of the soft magnetic material layer and a side surface of the magnetic section of the coupling layer.

11. The magnetic memory device according to claim 10, wherein the first predetermined distance is such that a magnetic coupling strength between the hard magnetic material layer and the soft magnetic material layer is reduced to the extent that a switching current of the free magnetic layer is about half compared to if the coupling layer is entirely formed of the magnetic section.

12. The magnetic memory device according to claim 11, wherein the magnetic section of the coupling layer is formed of a Heusler alloy, and
    wherein the non-magnetic section of the coupling layer is formed of an oxidized Heusler alloy.

13. The magnetic memory device according to claim 12, wherein the Heusler alloy includes manganese (Mn), silicon (Si), germanium (Ge), or a combination thereof, and the non-magnetic section of the coupling layer is formed of an oxide material.

14. The magnetic memory device according to claim 11, wherein the magnetic section of the coupling layer is formed of a silicon-based magnetic material, and
    wherein the non-magnetic section of the coupling layer is formed of an oxide material.

15. The magnetic memory device according to claim 10, wherein the coupling layer includes a first surface and a second surface, wherein the first surface of the coupling layer is flat at the magnetic section and is upwardly curved toward the edge of the coupling layer at the non-magnetic section, and wherein the second surface of the coupling layer is flat at the magnetic section and is downwardly curved toward the edge of the coupling layer at the non-magnetic section.

16. The magnetic memory device of claim 10, wherein the magnetic section is formed of a magnetic material only, and wherein the non-magnetic section is formed of an oxidized form of the magnetic material.

17. A magnetic memory device, comprising:

a free magnetic layer comprising:

a first magnetic material layer comprising a first magnetic anisotropy and having a first radius;

a second magnetic material layer comprising a second magnetic anisotropy and being stacked on the first magnetic material layer, the second magnetic anisotropy being less than the first magnetic anisotropy; and a third magnetic material layer interposed between the first magnetic material layer and the second magnetic material layer and having a second radius smaller than the first radius; and a non-magnetic oxide interposed between the first magnetic material layer and the second magnetic material layer, the non-magnetic oxide surrounding the third magnetic material layer and filling a space defined by an upper surface of the first magnetic material layer, a lower surface of the second magnetic material layer and a side surface of the third magnetic material layer, wherein the non-magnetic oxide has an increasing thickness away from the third magnetic material layer.

18. The magnetic memory device of claim 17, wherein the non-magnetic oxide is formed of an oxidized magnetic material of the third magnetic material layer.

19. The magnetic memory device of claim 18, wherein the non-magnetic oxide is further formed of an oxidized portion of the first magnetic material layer and an oxidized portion of the second magnetic material layer.

20. The magnetic memory device of claim 17, wherein the third magnetic material layer is formed of a magnetic material only, and wherein the non-magnetic oxide is formed of an oxidized form of the magnetic material of the third magnetic material layer.

* * * * *